United States Patent
Eom

(10) Patent No.: US 10,559,330 B2
(45) Date of Patent: Feb. 11, 2020

(54) MEMORY DEVICE HAVING SELECTABLE MEMORY BLOCK PAIRS

(71) Applicant: SK hynix Inc., Icheon-si, Gyeonggi-do (KR)

(72) Inventor: Dae Sung Eom, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/008,877

(22) Filed: Jun. 14, 2018

(65) Prior Publication Data

US 2019/0147918 A1    May 16, 2019

(30) Foreign Application Priority Data

Nov. 15, 2017 (KR) ............ 10-2017-0152546

(51) Int. Cl.
| | |
|---|---|
| G11C 5/02 | (2006.01) |
| G11C 7/18 | (2006.01) |
| G11C 16/08 | (2006.01) |
| H01L 27/24 | (2006.01) |
| G11C 8/06 | (2006.01) |
| G11C 5/06 | (2006.01) |
| H01L 27/06 | (2006.01) |
| G11C 8/10 | (2006.01) |
| G11C 8/12 | (2006.01) |
| G11C 16/24 | (2006.01) |

(Continued)

(52) U.S. Cl.
CPC .............. *G11C 5/025* (2013.01); *G11C 5/063* (2013.01); *G11C 7/18* (2013.01); *G11C 8/06* (2013.01); *G11C 8/10* (2013.01); *G11C 8/12* (2013.01); *G11C 16/08* (2013.01); *G11C 16/24* (2013.01); *H01L 27/0688* (2013.01); *H01L 27/2481* (2013.01); *G11C 16/0483* (2013.01); *G11C 16/10* (2013.01); *G11C 16/26* (2013.01); *H01L 27/11565* (2013.01); *H01L 27/11582* (2013.01)

(58) Field of Classification Search
CPC .......... G11C 5/025; G11C 8/10; G11C 5/063; G11C 8/06; G11C 16/08; G11C 16/10; G11C 7/18; H01L 27/0688; H01L 27/2481

See application file for complete search history.

(56) References Cited

U.S. PATENT DOCUMENTS

2007/0104002 A1* 5/2007 Edahiro .................. G11C 7/06
                                                          365/203
2013/0258772 A1* 10/2013 Lee ...................... G11C 7/18
                                                          365/185.03

(Continued)

FOREIGN PATENT DOCUMENTS

| KR | 1020140091250 A | 7/2014 |
| KR | 1020160047661 A | 5/2016 |

*Primary Examiner* — David Lam
(74) *Attorney, Agent, or Firm* — William Park & Associates Ltd.

(57) ABSTRACT

A memory device may include a first half memory block, a second half memory block, a row decoder group, and a read/write circuit which may be disposed between the first half memory block and the second half memory block. The read/write circuit may be coupled to the first half memory block and the second half memory block through a first bit line and a second bit line. The row decoder group may be configured to simultaneously select the first half memory block and the second half memory block in response to a single block selection signal.

20 Claims, 12 Drawing Sheets

(51) Int. Cl.
    *G11C 16/10*     (2006.01)
    *H01L 27/11582*     (2017.01)
    *G11C 16/26*     (2006.01)
    *G11C 16/04*     (2006.01)
    *H01L 27/11565*     (2017.01)

(56) References Cited

U.S. PATENT DOCUMENTS

| | | | | |
|---|---|---|---|---|
| 2015/0179264 A1* | 6/2015 | Kim | ............ | G11C 16/0483 |
| | | | | 365/185.11 |
| 2017/0285990 A1* | 10/2017 | Chen | ............ | G06F 3/0625 |
| 2017/0337981 A1* | 11/2017 | Lee | ............ | G11C 16/08 |

* cited by examiner

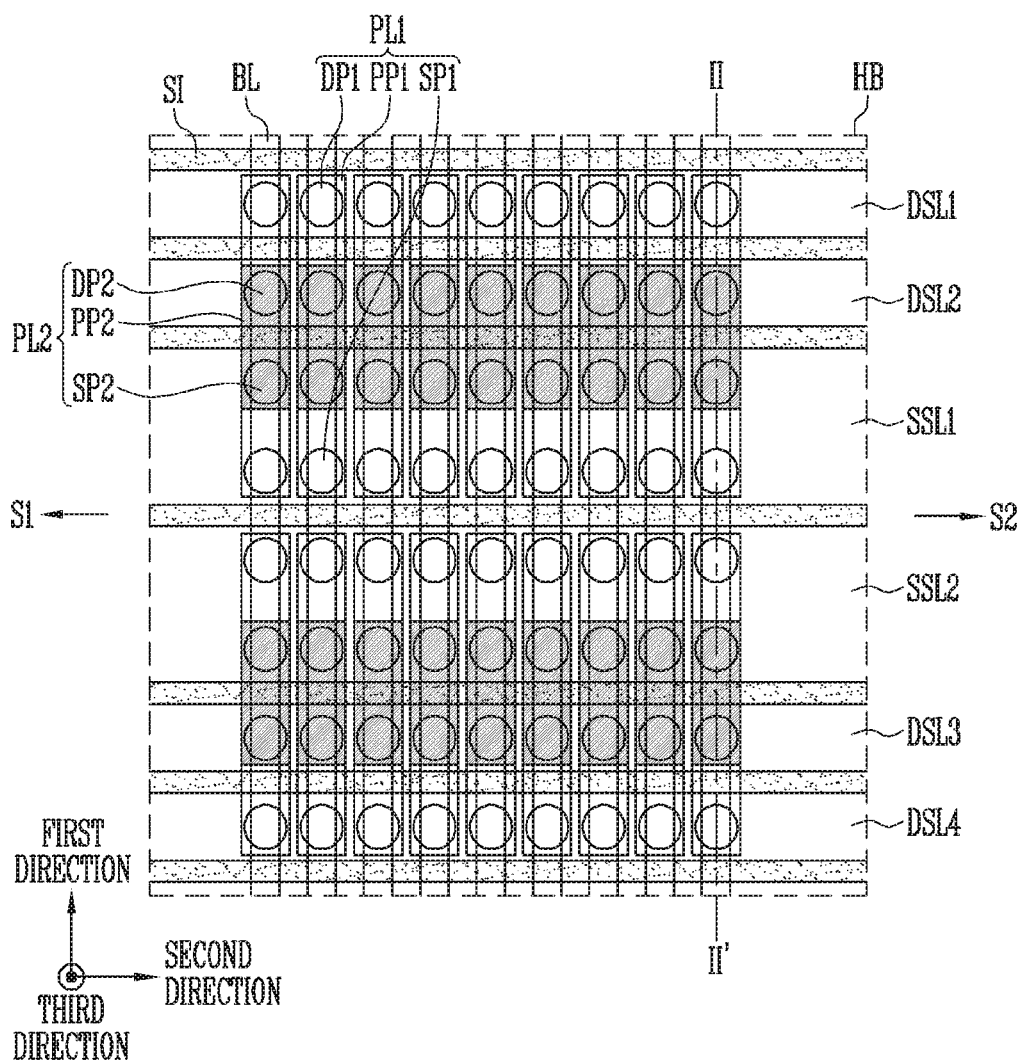

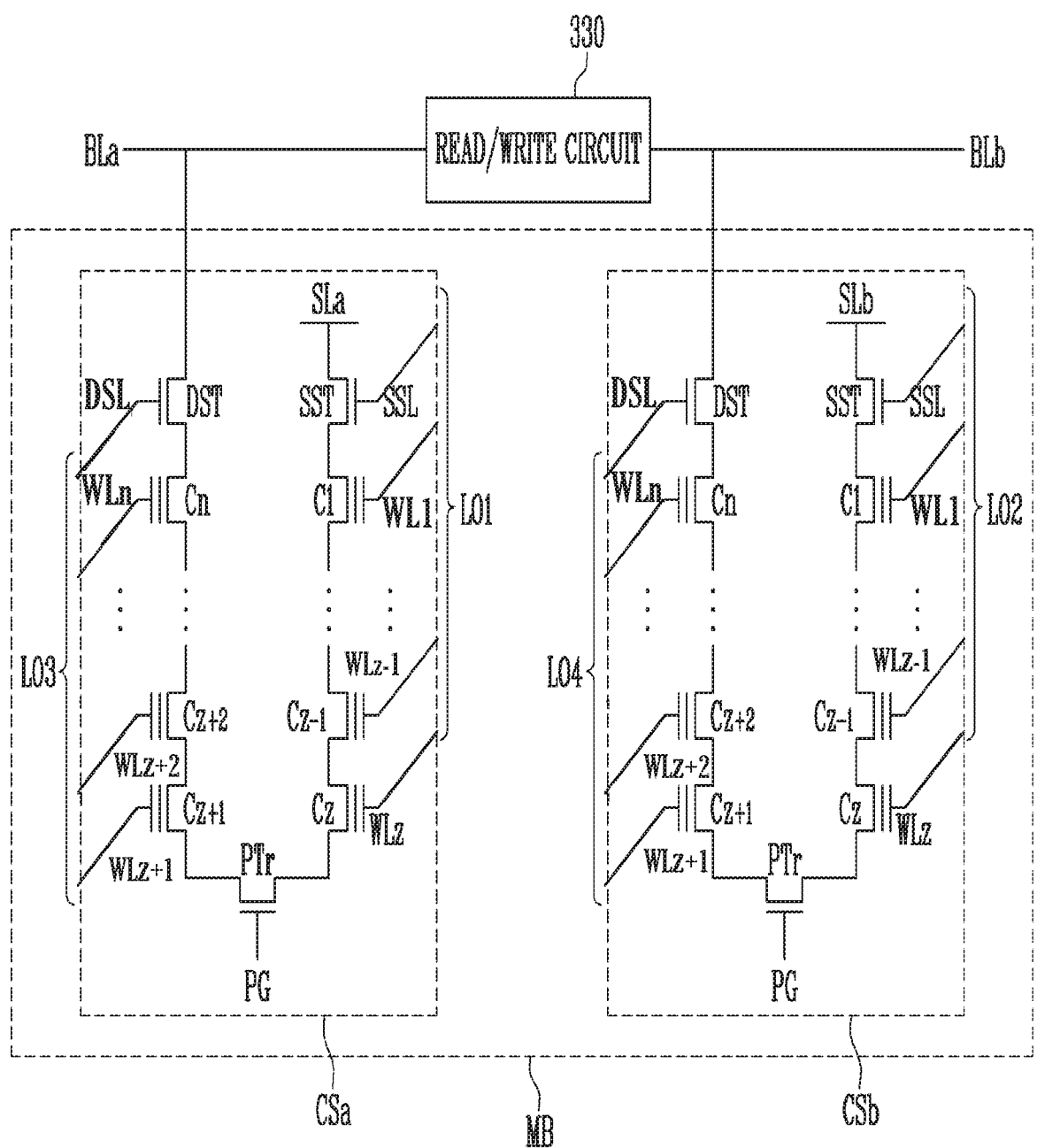

MEMORY DEVICE HAVING SELECTABLE MEMORY BLOCK PAIRS

CROSS-REFERENCE TO RELATED APPLICATION

The present application claims priority under 35 U.S.C. § 119(a) to Korean patent application number 10-2017-0152546 filed on Nov. 15, 2017, in the Korean Intellectual Property Office, the entire disclosure of which is incorporated herein by reference.

BACKGROUND

1. Technical Field

Various embodiments may generally relate to a memory device, and particularly, to a memory device including a three-dimensional cell array.

2. Related Art

A memory device may include a plurality of memory cells capable of storing data. The memory cells may be three-dimensionally arranged so as to achieve a high degree of integration of the semiconductor device.

The three-dimensionally arranged memory cells may be coupled through channel layers extending in the vertical direction. The channel layers may be arranged in a zigzag manner so as to increase the degree of integration of a memory cell array. In this case, it is difficult to secure an arrangement pitch between bit lines coupled to the channel layers, and an arrangement margin of the bit lines may become insufficient.

SUMMARY

According to an aspect of the present disclosure, a memory device may be provided. The memory device may include a first half memory block and a second half memory block. The memory device may include a read/write circuit disposed between the first half memory block and the second half memory block. The read/write circuit may be coupled to the first half memory block and the second half memory block through a first bit line and a second bit line. The memory device may include a first row decoder group configured to simultaneously select the first half memory block and the second half memory block in response to a single block selection signal.

According to an aspect of the present disclosure, a memory device may be provided. The memory device may include a first memory cell array including first half memory blocks and a second memory cell array including second half memory blocks. The memory device may include a read/write circuit disposed between the first memory cell array and the second memory cell array. The read/write circuit may be coupled to the first memory cell array and the second memory cell array through bit lines of a first group and bit lines of a second group. The memory device may include a first row decoder group and a second row decoder group, each configured to simultaneously select any one of a plurality of memory block pairs in response to a single block selection signal. Each of the memory block pairs may be configured with any one of the first half memory blocks and any one of the second half memory blocks.

BRIEF DESCRIPTION OF THE DRAWINGS

FIGS. 7A and 7B are diagrams illustrating a structure of each half memory block of the memory device according to an embodiment of the present disclosure.

FIG. 8 is a circuit diagram representation of a first cell string and a second cell string, which constitute a memory block of the memory device according to an embodiment of the present disclosure.

DETAILED DESCRIPTION

Figure 1:
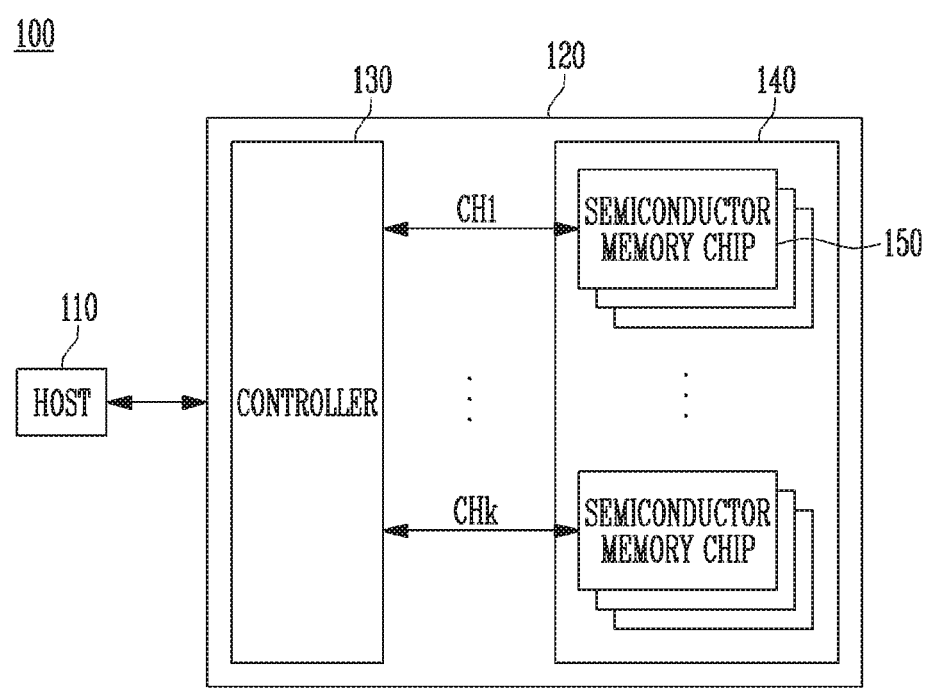
FIG. 1 is a diagram schematically illustrating an example of a data processing system including a memory system according to an embodiment of the present disclosure.

Various embodiments of the present disclosure will be described with reference to the accompanying drawings. The embodiments of the present disclosure may, however, be embodied in many different forms and should not be construed as limited to the embodiments set forth herein. Rather, the embodiments are provided so that disclosure of the present disclosure will be thorough and complete, and will fully convey the scope of the present disclosure to those skilled in the art. The features of the embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

It is also noted that, "on" refers to one component not only directly on another component but also indirectly on another component through an intermediate component or intermediate components. On the other hand, 'directly on' refers to one component directly on another component without an intermediate component.

It will be understood that when an element is referred to as being "between" two elements, it can be the only element between the two elements, or one or more intervening elements may also be present.

Embodiments of the present disclosure may provide a memory device capable of increasing the degree of freedom for arranging bit lines coupled to a three-dimensional memory cell array.

FIG. 1 is a diagram schematically illustrating an example of a data processing system including a memory system according to an embodiment of the present disclosure.

Referring to FIG. 1, the data processing system 100 may include a host 110 and a memory system 120.

The host 110 may communicate with the memory system 120, to store data in the memory system 120 or read data from the memory system 120. The host 110 may include various electronic devices. For example, the host 110 may include electronic devices such as mobile phones, MP3 players, and laptop computers or electronic devices such as desktop computers, game consoles, TVs, and projectors. The host 110 may communicate with the memory system 120 by using an interface protocol such as peripheral component interconnect-express (PCI-E), advanced technology attachment (ATA), serial ATA (SATA), parallel ATA (PATA), or serial attached SCSI (SAS).

The memory system 120 may operate in response to a request of the host 110. More specifically, the memory system 120 may include a memory device 140, for storing data accessed by the host 110, and a controller 130 for controlling the memory device 140.

The controller 130 and the memory device 140 may be integrated as one semiconductor memory device to implement the memory system 120. The memory system 120 may be implemented as any one of various types of storage devices according to the protocol of a host interface coupled to the host 110. For example, the memory system 120 may be implemented with any one of various storage devices such as a Solid State Drive (SSD), a memory card, a Universal Storage Bus (USB) device, a Universal Flash Storage (UFS) device, and a memory stick. When the memory system 120 is implemented as a semiconductor drive SSD, the operation speed of the host 110, coupled to the memory system 120, may be remarkably improved. The memory card may be implemented with any one of memory cards such as a Personal Computer Memory Card International Association (PCMCIA) card, a Compact Flash (CF) card, a Smart Media (SM) card, a Multi-Media card (MMC), and a Secure Digital (SD) card. The MMC may include an embedded MMC (eMMC), a Reduced Sized-MMC (RS-MMC), MMCmicro, and the like. The SD card may include a miniSD, a microSD, SDHC, and the like.

As another example, the memory system 120 may be included as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

The memory device 140 may receive a command, an address, and data from the controller 130 through channels CH1 to CHk, and the memory device 140 may transmit read data to the controller 130. The memory device 140 may perform an operation, corresponding to the received command, in an area selected by the address. Specifically, the memory device 140 may perform a program operation, a read operation, and an erase operation. In the program operation, the memory device 140 may program data in the area selected by the address. In the read operation, the memory device 140 may read data from the area selected by the address. In the erase operation, the memory device 140 may erase data stored in the area selected by the address.

The memory device 140 may include a plurality of semiconductor memory chips 150. The semiconductor memory chips 150 may communicate with the controller 130 through the channels CH1 to CHk. Although a case where a plurality of semiconductor memory chips 150 are coupled to one channel is illustrated in FIG. 1, the memory system 120 may also be implemented such that one semiconductor memory chip 150 is coupled to one channel. The semiconductor memory chips 150 may be implemented as one semiconductor package, using a Multi-Chip Package (MCP) technique, or be implemented as separate semiconductor packages.

Each of the semiconductor memory chips 150 may be a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In an embodiment, each of the semiconductor memory chips 150 may be implemented in a three-dimensional array structure. The embodiment of the present disclosure may be applied to not only a flash memory device in which a charge storage layer is configured with a Floating Gate (FG) but also a Charge Trap Flash (CTF) in which a charge storage layer is configured with an insulating layer. For convenience of description, it is assumed that each of the semiconductor memory chips 150 may be a NAND flash memory. However, the present disclosure is not limited thereto.

Figure 2:
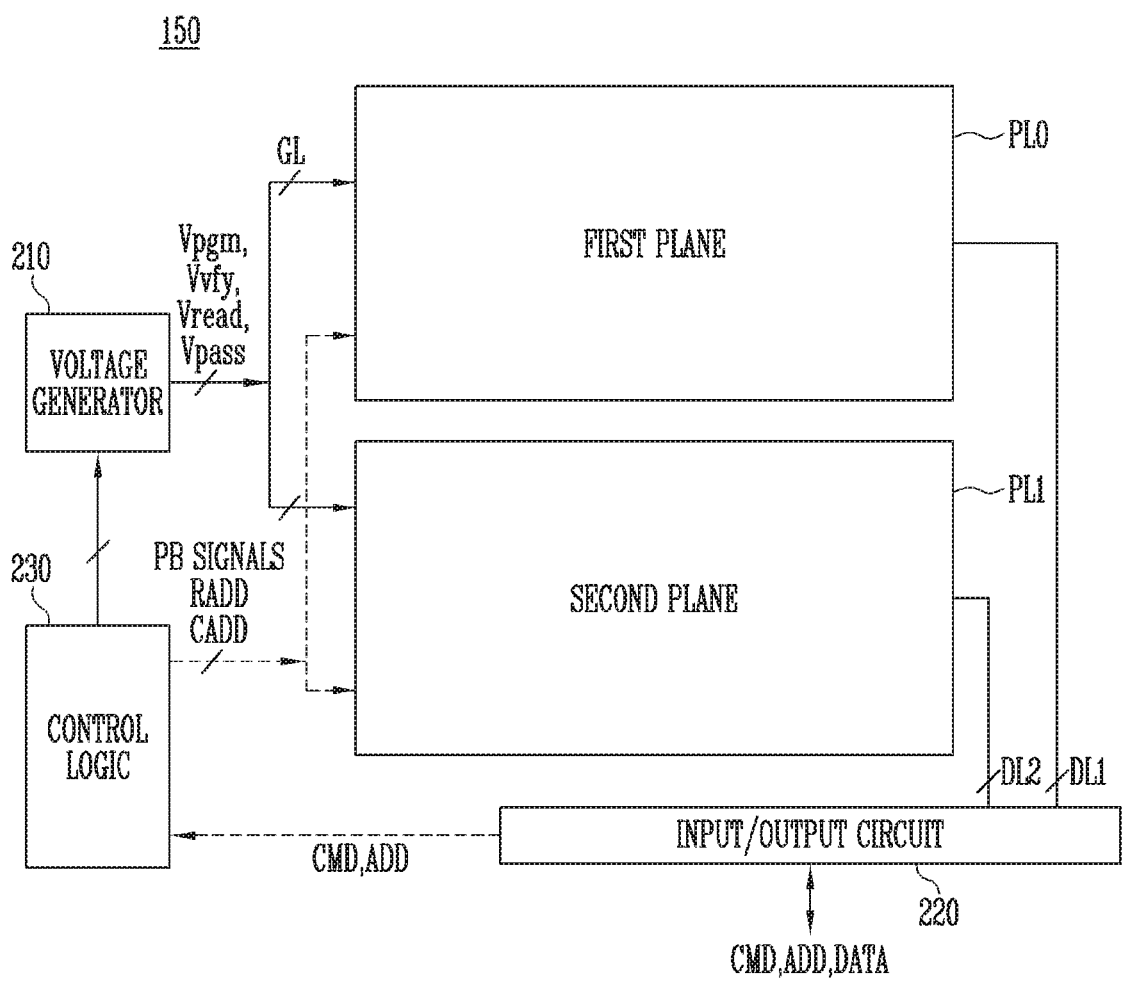
FIG. 2 is a block diagram illustrating a memory device according to an embodiment of the present disclosure.

FIG. 2 is a block diagram illustrating a memory device according to an embodiment of the present disclosure. Each of the semiconductor memory chips 150 shown in FIG. 1 may be configured as shown in FIG. 2.

Referring to FIG. 2, the semiconductor memory chip 150 may include a voltage generator 210, at least one plane, an input/output circuit 220, and a control logic circuit 230. For example, the semiconductor memory chip 150 may include a first plane PL0 and a second plane PL1. The number of planes constituting the semiconductor memory chip 150 is not limited to that shown in FIG. 2, and may be varied depending on the designs.

The control logic circuit 230 may be configured to control a program operation, a read operation, and an erase operation of the semiconductor memory chip 150 in response to a command CMD. The control logic circuit 230 may output operation signals for a program, verify, read, or erase operation.

The input/output circuit 220 may be coupled to the first plane PL0 and the second plane PL1 through first and second data lines DL1 and DL2, respectively. The input/output circuit 220 may operate in response to the control of the control logic circuit 230, and may be configured to exchange data DATA with the outside. The input/output circuit 220 may transfer data DATA input from the outside to the first plane PL0 and the second plane PL1, through the first and second data lines DL1 and DL2, and may output, to the outside, the data DATA transferred from the first plane PL0 and the second plane PL1 through the first and second data lines DL1 and DL2. Also, the input/output circuit 220 may transmit a command CMD and an address ADD, which are received from the controller 130 described in FIG. 1, to the control logic circuit 230.

The voltage generator 210 may generate operation voltages required to perform a program, verify, erase, or read operation of memory cells in response to the operation signals of the control logic circuit 230. The generated operation voltages (e.g., Vpgm, Vvfy, Vpass, and Vread) may be provided to global lines GL coupled to the first and second planes PL0 and PL1.

The first plane PL0 and the second plane PL1 may be configured identically to each other. Each plane may include a first memory cell array, a second memory cell array, at least one row decoder group, and a read/write circuit. The first memory cell array may include a plurality of first half blocks, and the second memory cell array may include a plurality of second half blocks. The row decoder group may be configured to select a pair of first and second half blocks in response to a block selection signal. The read/write circuit may include a page buffer group and a column decoder group.

The control logic circuit 230 may output page buffer signals PB SIGNALS for controlling the page buffer group to each plane according to the operation type of the semiconductor memory chip 150. The control logic circuit 230 may output a row address RADD and a column address CADD to each plane in response to the address ADD received from the input/output circuit 220. Each plane will be described later with reference to FIGS. 3 to 5.

Figure 3:
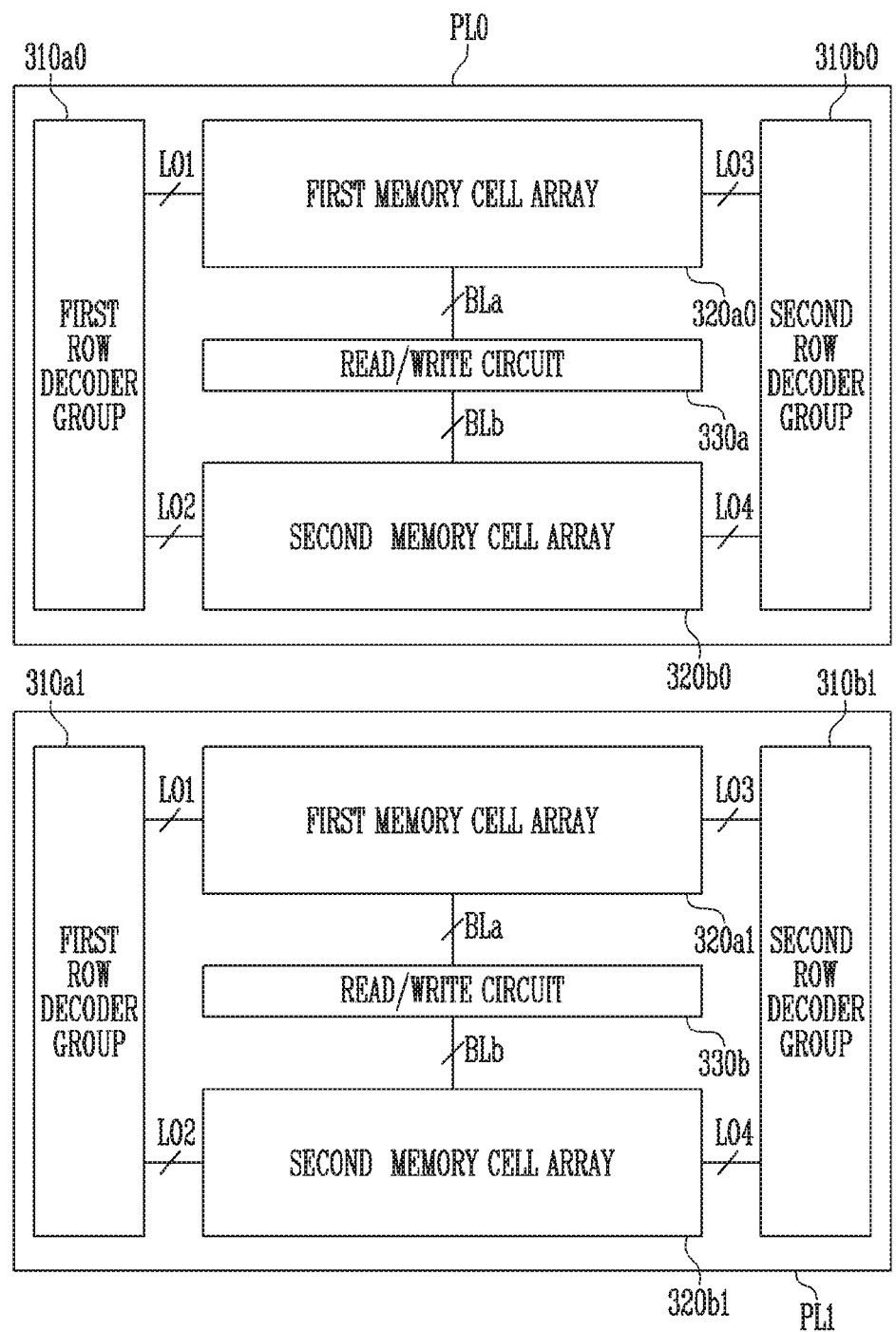
FIG. 3 is a block diagram illustrating each plane of the memory device according to an embodiment of the present disclosure.

FIG. 3 is a block diagram illustrating each plane of the memory device according to an embodiment of the present disclosure.

Referring to FIG. 3, the first plane PL0 may include a first memory cell array 320a0; a second memory cell array 320b0; and an operation circuit group 330a, 310a0, and 310b0. The operation circuit group 330a, 310a0, and 310b0 of the first plane PL0 may be configured to perform a program operation and a read operation of memory cells constituting the first memory cell array 320a0 and the second memory cell array 320b0, which may be included in the first plane PL0. The operation circuit group 330a, 310a0, and 310b0 may include a read/write circuit 330a, a first row decoder group 310a0, and a second row decoder group 310b0.

The second plane PL1 may include a first memory cell array 320a1; a second memory cell array 320b1; and an operation circuit group 330b, 310a1, and 310b1. The operation circuit group 330b, 310a1, and 310b1 of the second plane PL1 may be configured to perform a program operation and a read operation of memory cells constituting the first memory cell array 320a1 and the second memory cell array 320b1, which may be included in the second plane PL1. The operation circuit group 330b, 310a1, and 310b1 may include a read/write circuit 330b, a first row decoder group 310a1, and a second row decoder group 310b1.

The first memory cell array 320a0; the second memory cell array 320b0; and the operation circuit group 330a, 310a0, and 310b0 of the first plane PL0 may have circuit structures identical to those of the first memory cell array 320a1; the second memory cell array 320b1; and the operation circuit group 330b, 310a1, and 310b1 of the second plane PL1.

The first memory cell array 320a0 of the first plane PL0 and the first memory cell array 320a1 of the second plane PL1 may be coupled to the read/write circuits 330a and 330b corresponding thereto through bit lines BLa of a first group. The second memory cell array 320b0 of the first plane PL0 and the second memory cell array 320b1 of the second plane PL1 may be coupled to the read/write circuits 330a and 330b corresponding thereto through bit lines BLb of a second group.

The first memory cell array 320a0 of the first plane PL0 and the first memory cell array 320a1 of the second plane PL1 may be coupled to the first row decoder groups 310a0 and 310a1 corresponding thereto through local lines LO1 of a first group. The second memory cell array 320b0 of the first plane PL0 and the second memory cell array 320b1 of the second plane PL1 may be coupled to the first row decoder groups 310a0 and 310a1 corresponding thereto through local lines LO2 of a second group.

The first memory cell array 320a0 of the first plane PL0 and the first memory cell array 320a1 of the second plane PL1 may be coupled to the second row decoder groups 310b0 and 310b1 corresponding thereto through local lines LO3 of a third group. The second memory cell array 320b0 of the first plane PL0 and the second memory cell array 320b1 of the second plane PL1 may be coupled to the second row decoder groups 310b0 and 310b1 corresponding thereto through local lines LO4 of a fourth group.

In the above, the bit lines BLa of the first group, the bit lines BLb of the second group, the local lines LO1 of the first group, the local lines LO2 of the second group, the local line LO3 of the third group, and the local lines LO4 of the fourth group in the first plane PL0 may be components independent from the bit lines BLa of the first group, the bit lines BLb of the second group, the local lines LO1 of the first group, the local lines LO2 of the second group, the local line LO3 of the third group, and the local lines LO4 of the fourth group in the second plane PL1.

Figure 4:
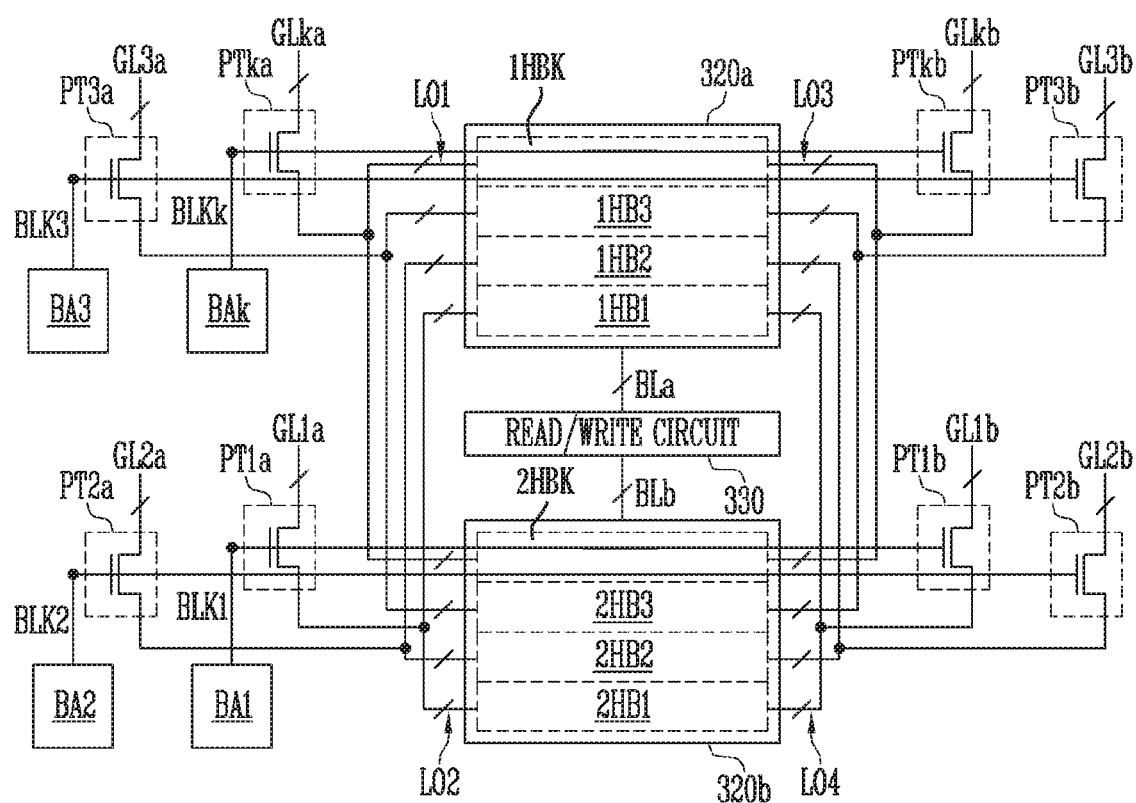
FIG. 4 is a block diagram illustrating memory cell arrays and row decoder groups of the memory device according to an embodiment of the present disclosure.

FIG. 4 is a block diagram illustrating memory cell arrays and row decoder groups of the memory device according to an embodiment of the present disclosure. The block diagram shown in FIG. 4 illustrates in detail a first memory cell array 320a, a second memory cell array 320b, a first row decoder group, and a second decoder group, which may constitute one plane. The structure shown in FIG. 4 may be applied to each of the first and second planes PL0 and PL1 shown in FIG. 3.

Referring to FIG. 4, the first memory cell array 320a may include first half memory blocks 1HB1 to 1HBk (k is an integer of 2 or more). The second memory cell array 320b may include second half memory blocks 2HB1 to 2HBk (k is an integer of 2 or more). The first half memory blocks 1HB1 to 1HBk may form pairs with the second half memory blocks 2HB1 to 2HBk to constitute a plurality of memory blocks, respectively. For example, a pair configured with the first half memory block 1HB1 and the second half memory block 2HB1 may constitute one memory block. In an embodiment, a first half memory block may be less or more than a half constituting a half of a memory block and a second half memory block may be less or more than a half constituting the other half of the memory block. In an embodiment, a first half memory block and a second half memory block, together, may constitute more than or less than one memory block. In an embodiment, first and second half memory blocks may constitute one memory block and the first half memory block may be equal to, less than, or greater than the second half memory block. The first half memory blocks 1HB1 to 1HBk (k is an integer of 2 or more) may be coupled to a read/write circuit 330 through bit lines BLa of a first group, and the second half memory blocks 2HB1 to 2HBk (k is an integer of 2 or more) may be coupled to the read/write circuit 330 through bit lines BLb of a second group.

The read/write circuit 330 may be disposed in an area between the first memory cell array 320a and the second memory cell array 320b, or the read/write circuit 330 may be disposed under the area between the first memory cell array 320a and the second memory cell array 320b so that the arrangement pitch, of the bit lines BLa of the first group and the bit lines BLb of the second group, may increase. For example, the read/write circuit 330 may be disposed between a substrate and the first and second memory cell arrays 320a and 320b.

The first half memory blocks 1HB1 to 1HBk may be coupled to the first row decoder group through local lines LO1 of a first group and may be coupled to the second row decoder group through local lines LO3 of a third group. The second half memory blocks 2HB1 to 2HBk may be coupled to the first row decoder group through local lines LO2 of a second group and may be coupled to the second row decoder group through local lines LO4 of a fourth group.

The first row decoder group may include first pass transistor groups PT1a to PTka. The first pass transistor groups PT1a to PTka may provide operation voltages, applied to global lines GL1a to GLka of a first group, to the local lines LO1 of the first group and the local lines LO2 of the second group in response to block selection signals BLK1 to BLKk. The operation voltages may be generated by the voltage generator 210, described in FIG. 2, to be supplied to the global lines GL1a to GLka of the first group.

The block selection signals BLK1 to BLKk may be output from block address decoders BA1 to BAk that may operate in response to the row address RADA described in FIG. 2. Each of the block address decoders BA1 to BAk may include a high-voltage switch.

Each of the first pass transistor groups PT1a to PTka may include a plurality of pass transistors that may operate in response to a block selection signal corresponding thereto among the block selection signals BLK1 to BLKk. For example, the first pass transistor group PT1a may include a plurality of pass transistors that may operate in response to a first block selection signal BLK1. The plurality of pass transistors constituting each of the first pass transistor groups PT1a to PTka may provide operation voltages to local lines of a pair of first and second half memory blocks corresponding thereto. For example, the plurality of pass transistors constituting the first pass transistor group PT1a may provide operation voltages to the local lines LO1 of the first group, which may be coupled to the first half memory block 1HB1 corresponding thereto, and the local lines LO2 of the second group, which may be coupled to the second half memory block 2HB1 corresponding thereto. That is, the operation voltages transmitted through the first pass transistor group, which may be controlled by one or a single block selection signal, may be provided to first and second half memory blocks that form a pair. In an embodiment, enabling a pass transistor group of the first row decoder group, in response to a block selection signal, to provide operation voltages to local lines LO1 of the first group and the local lines LO2 of the second group may also entail and be referred to as selecting the local lines LO1 of the first group and the local lines LO2 of the second group. Accordingly, this may also entail and be referred to as the first row decoder selecting the first half memory block through the local lines LO1 of the first group and selecting the second half memory block through the local lines LO2 of the second group, in response to a block selection signal.

The second row decoder group may include second pass transistor groups PT1b to PTkb. The second pass transistor groups PT1b to PTkb may provide operation voltages, applied to global lines GL1b to GLkb of a second group, to the local lines LO3 of the third group and the local lines LO4 of the fourth group in response to the block selection signals BLK1 to BLKk output from the block address decoders BA1 to BAk. The operation voltages may be generated by the voltage generator 210, described in FIG. 2, to be supplied to the global lines GL1b to GLkb.

Each of the second pass transistor groups PT1b to PTkb may include a plurality of pass transistors that may operate in response to a block selection signal corresponding thereto among the block selection signals BLK1 to BLKk. For example, the second pass transistor group PT1b may include a plurality of pass transistors that may operate in response to the first block selection signal BLK1. The plurality of pass transistors constituting each of the second pass transistor groups PT1b to PTkb may provide operation voltages to local lines of a pair of first and second half memory blocks corresponding thereto. For example, the plurality of transistors constituting the second pass transistor group PT1b may provide operation voltages to the local lines LO3 of the third group, which may be coupled to the first half memory block 1HB1 corresponding thereto, and the local lines LO4 of the fourth group, which may be coupled to the second half memory block 2HB1 corresponding thereto. That is, the operation voltages transmitted through the second pass transistor group, which may be controlled by one or a single block selection signal, may be provided to first and second half memory blocks that form a pair. In an embodiment, enabling a pass transistor group of the second row decoder group, in response to a block selection signal, to provide operation voltages to local lines LO3 of the third group and the local lines LO4 of the fourth group may also entail and be referred to as selecting the local lines LO3 of the third group and the local lines LO4 of the fourth group. Accordingly, this may also entail and be referred to as the second row decoder selecting the first half memory block through the local lines LO3 of the third group and selecting the second half memory block through the local lines LO4 of the fourth group, in response to a block selection signal.

Each of the block address decoders BA1 to BAk may provide the same block selection signal to a pair of first and second pass transistor groups corresponding thereto. For example, a first block address decoder BA1 may provide the first block selection signal BLK1 to the first and second pass transistor groups PT1a and PT1b corresponding thereto.

A pair of first and second half memory blocks that may receive operation voltages provided by a pair of first and second pass transistor groups controlled by the same block selection signal may constitute one memory block. For example, the first and second half memory blocks 1HB1 and 2HB1 coupled to the first or second pass transistor group PT1a or PT1b, controlled by the first block selection signal BLK1, may constitute one memory block.

Figure 5:
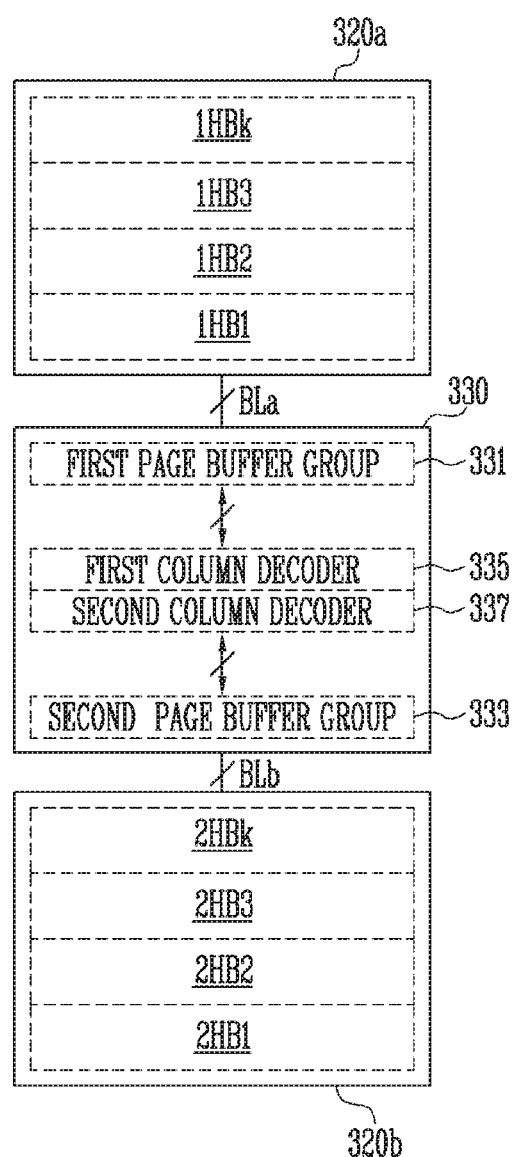
FIG. 5 is a block diagram illustrating memory cell arrays and a read/write circuit of the memory device according to an embodiment of the present disclosure.

FIG. 5 is a block diagram illustrating memory cell arrays and a read/write circuit of the memory device according to an embodiment of the present disclosure. The block diagram shown in FIG. 5 illustrates a first memory cell array 320a, a second memory cell array 320b, and a read/write circuit 330, which constitute one plane. The structure shown in FIG. 5 may be applied to each of the first plane PL0 and the second plane PL1.

Referring to FIG. 5, the read/write circuit 330 is disposed between the first memory cell array 320a and the second memory cell array 320b. As described in FIG. 4, first half memory blocks 1HB1 to 1HBk of the first memory cell array 320a and second half memory blocks 2HB1 to 2HBk of the second memory cell array 320b may form pairs with each other, and each of the pairs may constitute a memory block. According to such a structure, the read/write circuit 330 may be disposed between a first half memory block and a second half memory block, which constitute one memory block. For example, the read/write circuit 330 may be disposed between the first half memory block 1HB1 and the second half memory block 2HB1.

The read/write circuit 330 may include a first page buffer group 331, a second page buffer group 333, a first column decoder 335, and a second column decoder 337.

The first page buffer group 331 may be coupled to the first half memory blocks 1HB1 to 1HBk of the first memory cell array 320a through bit lines BLa of a first group. The second page buffer group 333 may be coupled to the second half memory blocks 2HB1 to 2HBk of the second memory cell array 320b through bit lines BLb of a second group. The first page buffer group 331 and the second page buffer group 333 may apply voltages necessary for a selected operation to the bit lines BLa and BLb, of the first and second groups, in response to the page buffer signals PB SIGNALS output from the control logic circuit 230 described in FIG. 2. The first page buffer group 331 may include a plurality of page buffers respectively coupled to the bit lines BLa of the first group. The second page buffer group 333 may include a plurality of page buffers respectively coupled to the bit line BLb of the second group.

The first column decoder 335 may select each of the page buffers included in the first page buffer group 331 in response to the column address CADD output from the control logic circuit 230 described in FIG. 2. The second column decoder 337 may select each of the page buffers included in the second page buffer group 333 in response to the column address CADD output from the control logic circuit 230 described in FIG. 2.

Each of the page buffers may include latches for temporarily storing data to be stored in a program operation, data read in a read operation, or data read in a verify operation. Data of a page buffer selected by the first column decoder 335 or the second column decoder 337 may be output to the input/output circuit 220 shown in FIG. 2. Program data may be input to the page buffer selected by the first column decoder 335 or the second column decoder 337.

The first half memory blocks 1HB1 to 1HBk of the first memory cell array 320a and the second half memory blocks 2HB1 to 2HBk of the second memory cell array 320b may be formed in the same structure.

As described in FIGS. 3 to 5, according to an embodiment of the present disclosure, page buffers may be disposed between a first half memory block and a second half memory block. Here, the first half memory block and the second half memory block may operate by being applied with operation voltages in response to the same block selection signal, and may constitute one memory block. If the page buffers are disposed between the first half memory block and the second half memory block as described above, bit lines constituting the one memory block may be divided into bit lines of a first group, which extend toward the first half memory block from the page buffers, and bit lines of a second group, which extend toward the second half memory block from the page buffers. That is, the bit lines of the first group and the bit lines of the second group, which constitute the one memory block, extend in directions opposite to each other. Thus, in an embodiment of the present disclosure, the arrangement pitch between the bit lines may be widened as compared with a case where the bit lines of the first group and the bit lines of the second group, which constitute the one memory block, are instead arranged in the same area. Further, in an embodiment of the present disclosure, the degree of freedom for arranging the bit lines may be increased.

Figure 6A:
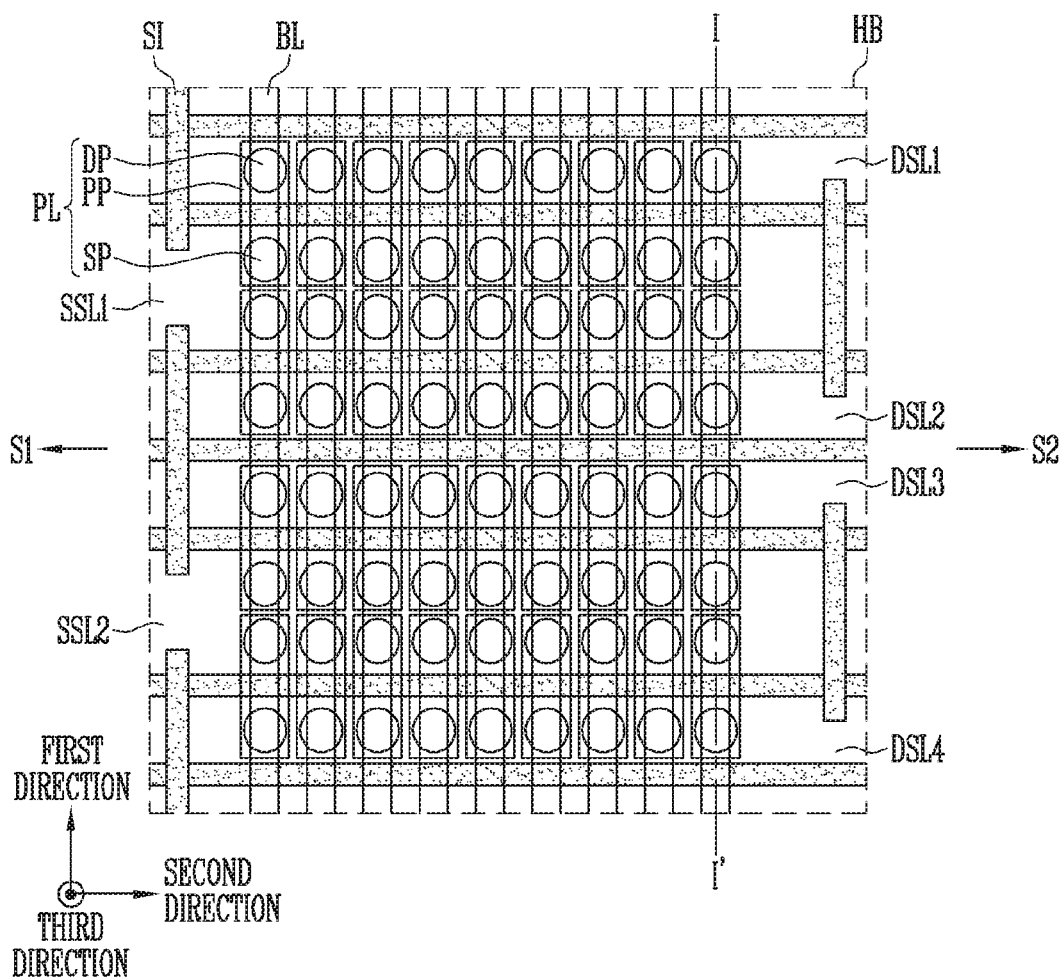
FIGS. 6A and 6B are diagrams illustrating a structure of each half memory block of the memory device according to an embodiment of the present disclosure.
Figure 6B:
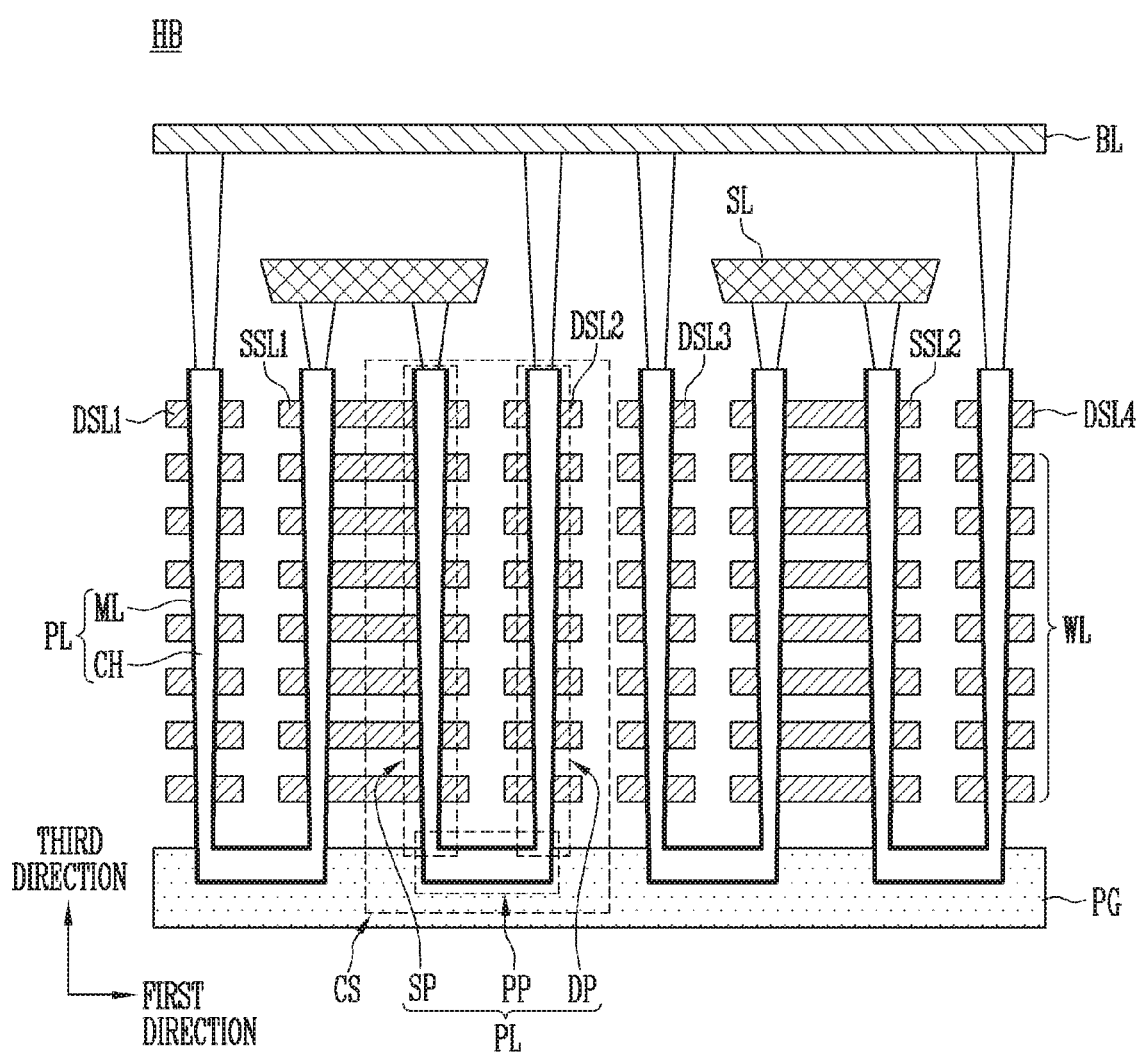

FIGS. 6A and 6B are diagrams illustrating a structure of each half memory block of the memory device according to an embodiment of the present disclosure. FIG. 6A is a diagram illustrating a layout of the half memory block, and FIG. 6B is a diagram illustrating a cross-sectional view of the half memory block structure taken along line I-I' shown in FIG. 6A. For convenience of description, illustration of insulating layers will be omitted in FIG. 6B. The structure of the half memory block shown in FIGS. 6A and 6B may be applied to each of the first half memory blocks 1HB1 to 1HBk and the second half memory blocks 2HB1 to 2HBk, which are shown in FIGS. 4 and 5.

Referring to FIGS. 6A and 6B, the half memory block HB may be formed in a three-dimensional structure. For example, the half memory block HB may include structures extending along first to third directions intersecting one another. The first to third directions may correspond to X, Y, and Z directions in an XYZ coordinate system.

The half memory block HB may include a plurality of cell strings CS arranged along the first direction and the second direction. The half memory block HB may be coupled to a plurality of bit lines BL, a common source line SL, and a plurality of local lines SSL1, SSL2, DSL1, DSL2, DSL3, DSL4, and WL.

The local lines SSL1, SSL2, DSL1, DSL2, DSL3, DSL4, and WL may include at least one source select line, at least one drain select line, and a plurality of word lines WL. In the drawings, a case where the half memory block HB includes two source select lines SSL1 and SSL2 divided by a slit SI and four drain select lines DSL1, DSL2, DSL3, and DSL4 divided by slits SI is illustrated as an example, but the present disclosure is not limited thereto.

A plurality of word lines WL may be stacked under each of the source select lines SSL1 and SSL2 and the drain select lines DSL1, DSL2, DSL3, and DSL4. The slit SI may allow the source select lines SSL1 and SSL2 and the drain select lines DSL1, DSL2, DSL3, and DSL4 to be isolated from each other in a plane extending along the first and second directions. The slit SI may allow the word lines WL to be isolated from each other in the plane extending along the first and second directions.

Each of the cell strings CS may be defined along a pillar PL. The pillar PL may include a channel layer CH and a memory layer ML surrounding an outer wall of the channel layer CH. The channel layer CH may be used as a channel region of the cell string CS, and a central region of the channel layer CH may be filled with a gap-fill insulating layer. The memory layer ML may be used as a data storage layer.

The pillar PL may be divided into a source-side pillar SP, a drain-side pillar DP, and a connection part PP connecting the source-side pillar SP and the drain-side pillar DP. The source-side pillar SP and the drain-side pillar DP may extend in parallel to each other. A plurality of source-side pillars SP and a plurality of drain-side pillars DP, which constitute the cell strings CS, may be arranged in a checkerboard type pattern. Accordingly, it may be possible to easily perform a step of forming the local lines SSL1, SSL2, DSL1, DSL2, DSL3, DSL4, and WL, using a gate conductive layer gap fill process. In addition, it may be possible to easily control the critical line width of each of the source-side pillars SP and the drain-side pillars DP.

Each of the bit lines BL may extend along the first direction. The bit lines BL may be arranged in the second direction. The bit lines BL may correspond to the bit lines of the first group or the bit lines of the second group, which are shown in FIGS. 2 to 5. The arrangement pitch of the bit lines BL may be defined by the distance between the source-side pillars SP adjacent to each other or the distance between the drain-side pillars DP adjacent to each other.

The source-side pillar SP of each of the cell strings CS may be coupled to the common source line SL, and the drain-side pillar DP of each of the cell strings CS may be coupled to a bit line BL corresponding thereto. The connection part PP of each of the cell strings CS may be buried in a pipe gate PG. The source-side pillar SP may extend toward the common source line SL from the connection part PP, and may penetrate word lines WL and a source select line SSL1 or SSL2, which correspond thereto. The drain-side pillar DP may extend towards a bit line BL corresponding thereto from the connection part PP, and may penetrate word lines WL and a drain-select line (one of DSL1 to DSL4), which correspond thereto.

The local lines SSL1, SSL2, DSL1, DSL2, DSL3, DSL4, and WL may be divided into the local lines of the first and third groups, which are described in FIGS. 3 and 4, or be divided into the local lines of the second and fourth groups, which are described in FIGS. 3 and 4.

As an example, when the half memory block HB shown in FIGS. 6A and 6B is a first half memory block, the local lines SSL1, SSL2, DSL1, DSL2, DSL3, DSL4, and WL may be divided into the local lines of the first group and the local lines of the third group. The local lines of the first group may include the source select lines SSL1 and SSL2 and word lines WL thereunder. The local lines of the third group may include the drain select lines DSL1, DSL2, DSL3, and DSL4 and word lines WL thereunder.

The local lines of the first group may extend toward a first side S1 to be coupled to the first row decoder group. The local lines of the third group may extend toward a second side S2, opposite to the first side S1, to be coupled to the second row decoder group.

As another example, the local lines SSL1, SSL2, DSL1, DSL2, DSL3, DSL4, and WL of the half memory block HB may be divided into the local lines of the second group and the local lines of the fourth group. In this case, the local lines of the second group may extend toward the first side S1 to be coupled to the first row decoder group. The local lines of the fourth group may extend toward the second side S2, opposite to the first side S1, to be coupled to the second row decoder group.

Figure 7B:
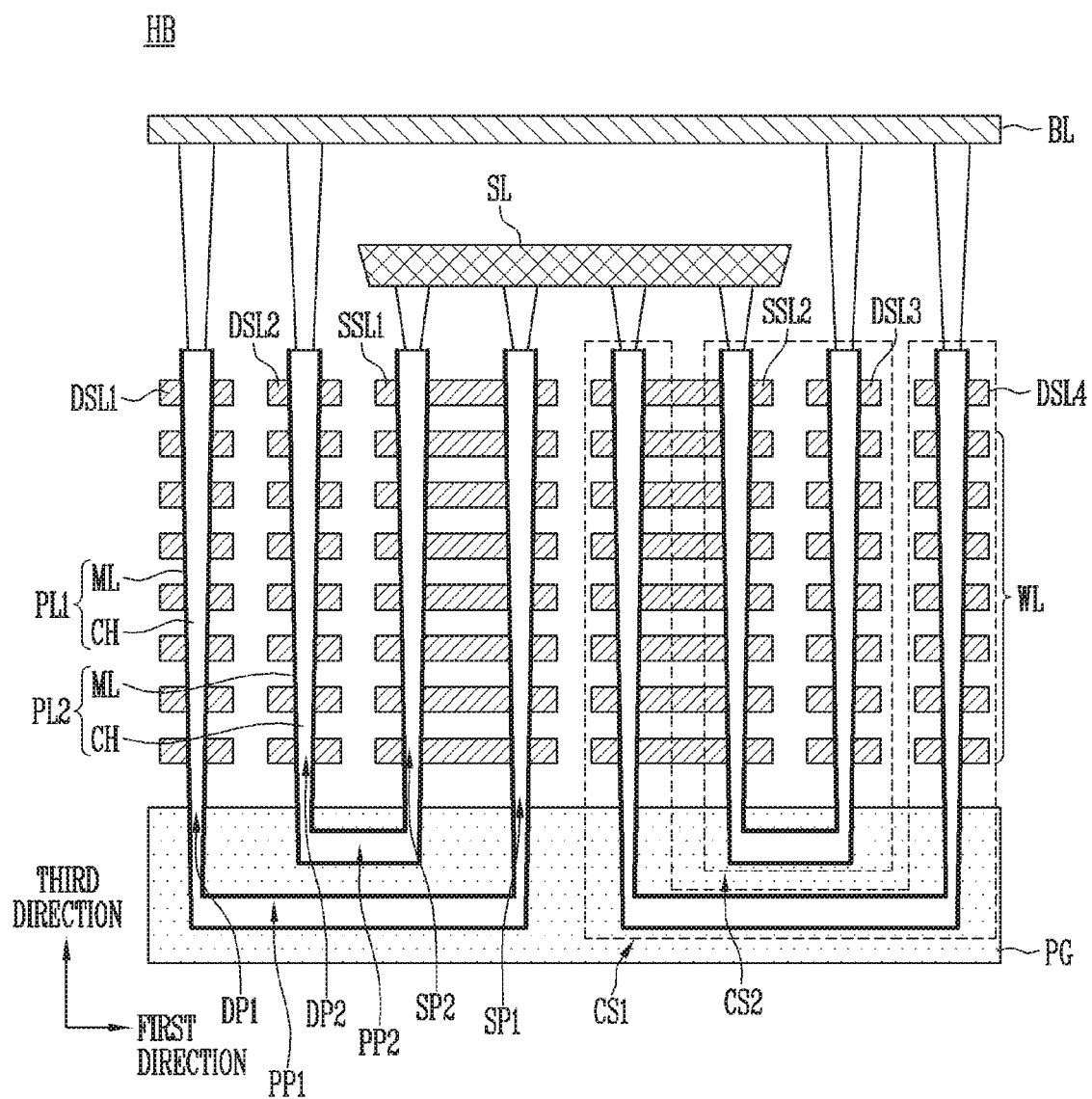

FIGS. 7A and 7B are diagrams illustrating a structure of each half memory block of the memory device according to an embodiment of the present disclosure. FIG. 7A is a diagram illustrating a layout of the half memory block, and FIG. 7B is a diagram illustrating a cross-sectional view of the half memory block structure taken along line II-II' shown in FIG. 7A. For convenience of description, illustration of insulating layers will be omitted in FIG. 7B. The structure of the half memory block shown in FIGS. 7A and 7B may be applied to each of the first half memory blocks 1HB1 to 1HBk and the second half memory blocks 2HB1 to 2HBk, which are shown in FIGS. 4 and 5. Hereinafter, structures identical to those of FIGS. 6A and 6B and their overlapping descriptions will be omitted.

Referring to FIGS. 7A and 7B, the half memory block HB may include a plurality of first type cell strings CS1 and a plurality of second type cell strings CS2. The half memory block HB may be coupled to a plurality of bit lines BL, a common source line SL, and a plurality of local lines SSL1, SSL2, DSL1, DSL2, DSL3, DSL4, and WL.

The local lines SSL1, SSL2, DSL1, DSL2, DSL3, DSL4, and WL, as described in FIGS. 6A and 6B, may include source select lines SSL1 and SSL2 divided by a slit SI, drain select lines DSL1, DSL2, DSL3, and DSL4 divided by slits SI, and word lines WL divided by the slit SI.

Each of the first type cell strings CS1 may be defined along a first pillar PL1, and each of the second type cell strings CS2 may be defined along a second pillar PL2. Each of the first pillar PL1 and the second pillar PL2, as described in FIGS. 6A and 6B, may include a channel layer CH and a memory layer ML. The first pillar PL1 may include a first source-side pillar SP1, a first drain-side pillar DP1, and a first connection part PP1 connecting the first source-side pillar SP1 and the first drain-side pillar DP1. The second pillar PL2 may include a second source-side pillar SP2, a second drain-side pillar DP2, and a second connection part PP2 connecting the second source-side pillar SP2 and the second drain-side pillar DP2.

The first pillar PL1 and the second pillar PL2 may extend in parallel to each other. The first pillar PL1 may be disposed further outward than the second pillar PL2. More specifically, the second drain-side pillar DP2 and the second source-side pillar SP2 of the second pillar PL2 may be disposed between the first drain-side pillar DP1 and the first source-side pillar SP1 of the first pillar PL1. The first drain-side pillar DP1 and the first source-side pillar SP1 of the first pillar PL1 may extend longer toward a pipe gate PG than the second drain-side pillar DP2 and the second source-side pillar SP2 of the second pillar PL2. The first connection part PP1 of the first pillar PL1 and the second connection part PP2 of the second pillar PL2 may be buried in the pipe gate PG. The first connection part PP1 may be disposed under the second connection part PP2 and may overlap with the second connection part PP2. The first connection part PP1 may extend to a first length from the first drain-side pillar DP1 toward the first source-side pillar SP1. The second connection part PP2 may extend to a second length, shorter than the first length, from the second drain-side pillar DP2 toward the second-source side pillar SP2.

Each of the bit lines BL may be commonly coupled to the first type cell string CS1 and the second type cell string CS2, and the common source line SL may be commonly coupled to the first type cell string CS1 and the second type cell string CS2.

Each of the source select lines SSL1 and SSL2 may be commonly coupled to a first type cell string CS1 and a second type cell string CS2, which correspond thereto. The first type cell string CS1 and the second type cell string CS2 may be coupled to drain select lines isolated from each other in order to be individually controlled by the drain select lines DSL1, DSL2, DSL3, and DSL4. For example, the first type cell string CS1 may be coupled to a first drain select line DSL1, and the second type cell string CS2 may be coupled to a second drain select line DSL2.

The local lines SSL1, SSL2, DSL1, DSL2, DSL3, DSL4, and WL may be divided into the local lines of the first and third groups, which are described in FIGS. 3 and 4, or be divided into the local lines of the second and fourth groups, which are described in FIGS. 3 and 4. The local lines of the first group or the local lines of the second group may extend toward a first side S1 to be coupled to the first row decoder group. The local lines of the third group or the local lines of the fourth group may extend toward a second side S2 to be coupled to the second row decoder group.

FIG. 8 is a circuit diagram representation of a first cell string and a second cell string, which constitute a memory block of the memory device according to an embodiment of the present disclosure.

FIG. 8 is a circuit diagram illustrating a first cell string structure of the first half memory block and a second cell string structure of the second half memory block in the memory device according to the embodiment of the present disclosure. The first cell string CSa shown in FIG. 8 may be included in the first memory cell array shown in FIG. 3 and may be included in any one of the first half memory blocks shown in FIGS. 4 and 5. The second cell string CSb shown in FIG. 8 may be included in the second memory cell array shown in FIG. 3 and may be included in any one of the second half memory blocks shown in FIGS. 4 and 5.

The circuit diagram of each of the first cell string CSa and the second cell string CSb, which are shown in FIG. 8, may correspond to that of each of the cell strings described in FIGS. 6A and 6B. The circuit diagram of each of the first cell string CSa and the second cell string CSb, which are shown in FIG. 8, may correspond to that of each of the first type cell strings and the second type cell strings, which are described in FIGS. 7A and 7B.

Referring to FIG. 8, the first cell string CSa and the second cell string CSb may be configured as circuits having the same structure. Each of the first cell string CSa and the second cell string CSb may include a source select transistor SST, source-side memory cells C1 to Cz, a pipe transistor PTr, drain-side memory cells Cz+1 to Cn, and a drain select transistor DST. A gate of the source select transistor SST may be coupled to a source select line SSL, and a gate of the drain select transistor DST may be coupled to a drain select line DSL. Gates of the source-side memory cells C1 to Cz may be coupled to source-side word lines WL1 to WLz, and gates of the drain-side memory cells Cz+1 to Cn may be coupled to drain-side word lines WLz+1 to WLn. A gate of the pipe transistor PTr may be coupled to a pipe gate PG. The source select transistor SST, the source-side memory cells C1 to Cz, the pipe transistor PTr, the drain-side memory cells Cz+1 to Cn, and the drain select transistor DST may be coupled in series by the channel layer shown in FIG. 6B or 7B.

The source select line SSL and the source-side word lines WL1 to WLz may correspond to any one of the source select lines shown in FIGS. 6A and 6B and the word lines thereunder, respectively. Alternatively, the source select line SSL and the source-side word lines WL1 to WLz may correspond to any one of the source select lines shown in FIGS. 7A and 7B and the word lines thereunder, respectively.

The drain select line DSL and the drain-side word lines WLz+1 to WLn may correspond to any one of the drain select lines shown in FIGS. 6A and 6B and the word lines thereunder, respectively. Alternatively, the drain select line DSL and the drain-side word lines WLz+1 to WLn may correspond to any one of the drain select lines shown in FIGS. 7A and 7B and the word lines thereunder, respectively.

The source select line SSL and the source-side word lines WL1 to WLz of the first cell string CSa may constitute local lines LO1 of a first group, and the drain select line DSL and the drain-side word lines WLz+1 to WLn of the first cell string CSa may constitute local lines LO3 of a third group. The source select line SSL and the source-side word lines WL1 to WLz of the second cell string CSb may constitute local lines LO2 of a second group, and the drain select line DSL and the drain-side word lines WLz+1 to WLn of the second cell string CSb may constitute local lines LO4 of a fourth group.

The memory block MB may be configured with a pair of first and second half memory blocks, and the pair of first and second half memory blocks may be simultaneously controlled by the same block selection signal. For example, the local lines LO1 and LO3 of the first and third groups of the first cell string CSa included in the first half memory block may be simultaneously controlled with the local lines LO2 and LO4 of the second and fourth groups of the second cell string CSb included in the second half memory block. The local lines LO1 of the first group and the local lines LO2 of the second group may be controlled by one of the pass transistor groups constituting the first row decoder group described in FIGS. 3 and 4. The local lines LO3 of the third group and the local lines LO4 of the fourth group may be controlled by one of the pass transistor groups constituting the second row decoder group described in FIGS. 3 and 4. In an embodiment, in accordance with the above, simultaneously controlling of the first and second half memory blocks by the same block selection signal may also entail and be referred to as simultaneously selecting the first and second half memory blocks in response to the same block selection signal. The controlling or the simultaneously controlling of the respective local lines of the first to fourth groups by the respective pass transistor groups, of the first and second row decoder groups, may also entail and be referred to as the selecting or the simultaneously selecting of the respective local lines of the first to fourth groups by the associated row decoder group.

The first cell string CSa may be coupled between a first bit line BLa and a first common source line SLa, and the second cell string CSb may be coupled between a second bit line BLb and a second common source line SLb. The first bit line BLa and the second bit line BLb may be coupled to a read/write circuit 330. The first bit line BLa and the second bit line BLb may extend in directions opposite to each other. Accordingly, the first bit line BLa and the second bit line BLb, which constitute the memory block MB, may be disposed in areas independent from each other, so that it may be possible to increase the degree of freedom for arranging the first bit line BLa and the degree of freedom for arranging the second bit line BLb. Thus, in an embodiment of the present disclosure, as the arrangement pitch between the bit lines are widened, the parasitic capacitance between the bit lines may be decreased, and the operational reliability of the memory device may be improved. Also, according to an embodiment of the present disclosure, as the arrangement margin of the bit lines is widened, the level of difficulty for fabricating (i.e., processing) the bit lines may be lowered. In addition, according to an embodiment of the present disclosure, the memory block MB may be divided into two halves coupled to the read/write circuit 330, so that the lengths of the first bit line BLa and the second bit line BLb may be decreased. Accordingly, in an embodiment of the present disclosure, the loading of a signal transmitted on a bit line may be reduced, thereby increasing the sensing margin.

In accordance with the above, in an embodiment of the present disclosure, the first bit line BLa may be operated as an even bit line, and the second bit line BLb may be operated as an odd bit line.

Figure 9:
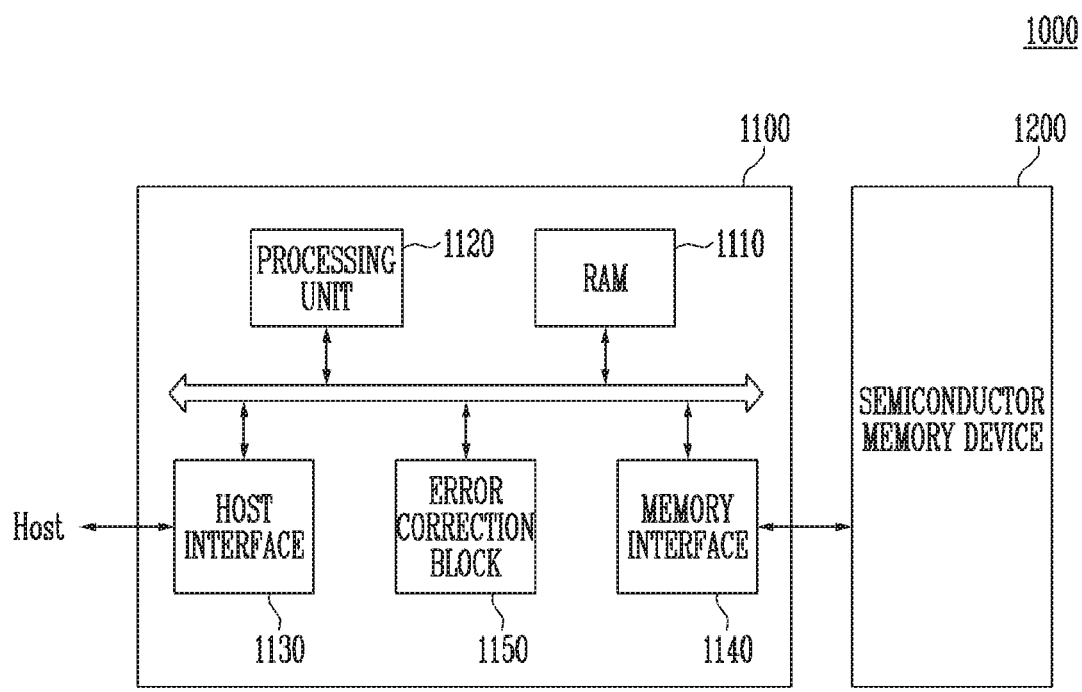
FIG. 9 is a block diagram illustrating a memory system including a memory device according to an embodiment of the present disclosure.

FIG. 9 is a block diagram illustrating a memory system including a memory device according to an embodiment of the present disclosure.

A semiconductor memory device 1200 may be configured and operated as described with reference to FIGS. 2 to 5. Hereinafter, overlapping descriptions will be omitted.

A controller 1100 may be operated as described in FIG. 1. The controller 1100 may be configured to provide an interface between the semiconductor memory device 1200 and a host Host. The controller 1100 may be configured to drive firmware for controlling the semiconductor memory device 1200.

The controller 1100 may include a random access memory (RAM) 1110, a processing unit 1120, a host interface 1130, a memory interface 1140, and an error correction block 1150. The RAM 1110 may be used, as at least one of, a working memory of the processing unit 1120, a cache memory between the semiconductor memory device 100 and the host Host, and a buffer memory between the semiconductor memory device 1200 and the host Host. The processing unit 1120 may control overall operations of the controller 1100. In addition, the controller 1100 may temporarily store program data provided by the host Host for a write operation.

The host interface 1130 may include a protocol for exchanging data between the host Host and the controller 1100. In an embodiment, the controller 1100 may be configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 may interface with the semiconductor memory device 1200. For example, the memory interface 1140 may include a NAND interface or a NOR interface.

The error correction block 1150 may be configured to detect and correct an error for data received from the semiconductor memory device 1200 by using an error correction code (ECC). The processing unit 1120 may control the semiconductor memory device 1200 to adjust a read voltage, based on an error detection result of the error correction block 1150, and to perform re-reading. In an embodiment, the error correction block 1150 may be provided as a component of the controller 1100.

The controller 1100 and the semiconductor memory device 1200 may be integrated as one semiconductor device as described in FIG. 1.

In an embodiment, the semiconductor memory device 1200 or the memory system 1000 may be packaged in various forms. For example, the semiconductor memory device 1200 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 10:
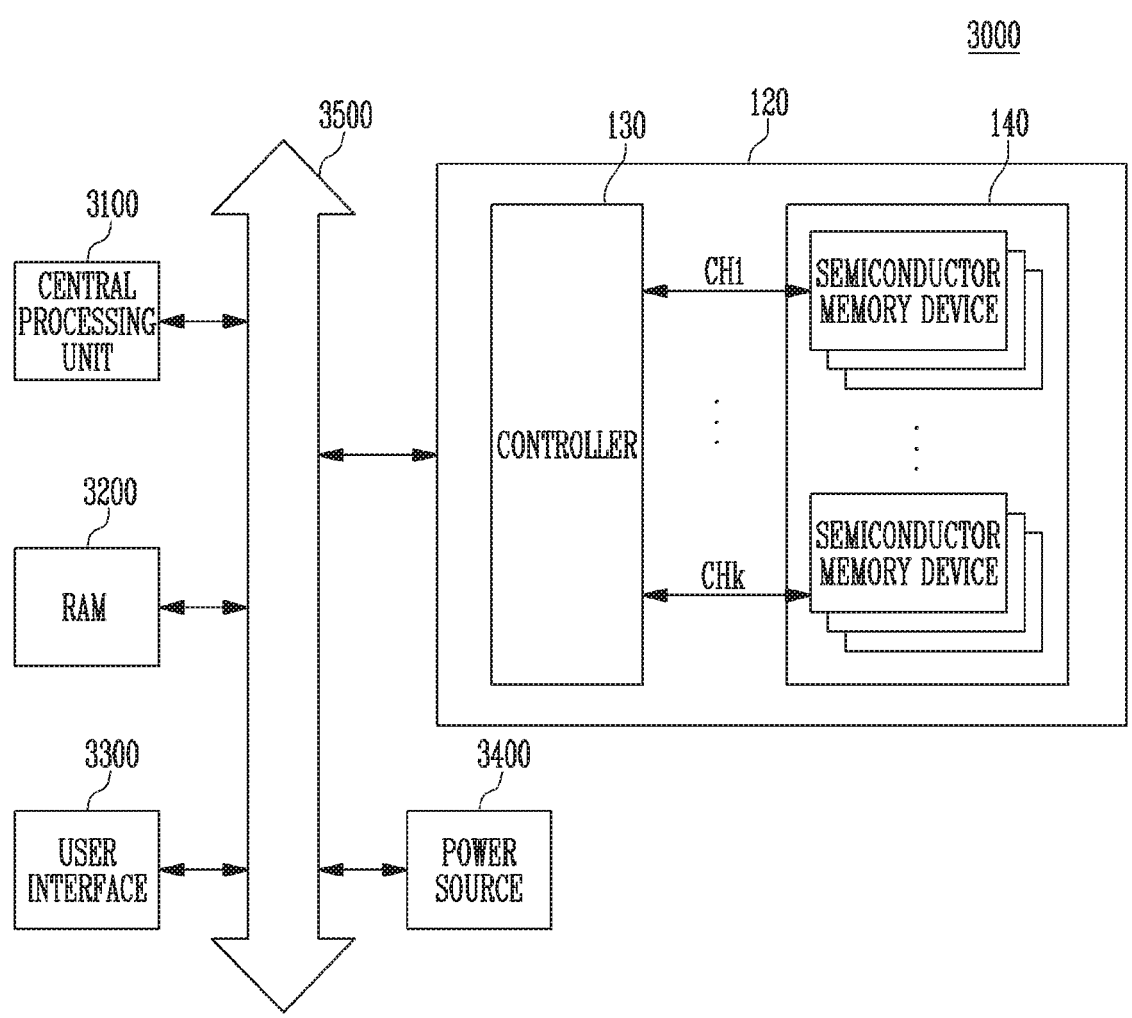
FIG. 10 is a block diagram illustrating a computing system including a memory system according to an embodiment of the present disclosure.

FIG. 10 is a block diagram illustrating a computing system including a memory system according to an embodiment of the present disclosure.

The computing system 3000 may include a central processing unit 3100, a RAM 3200, a user interface 3300, a power source 3400, a system bus 3500, and a memory system 120.

The memory system 120 may be electrically coupled to the central processing unit 3100, the RAM 3200, the user interface 3300, and the power source 3400 through the system bus 3500. Data supplied through user interface 3300 or data processed by the central processing unit 3100 may be stored in the memory system 120.

In FIG. 10, it is illustrated that a memory device 140 may be coupled to the system bus 3500 through a controller 130 and channels CH1 to CHk. However, the memory device 140 may be directly coupled to the system bus 3500. In this case, the function of the controller 130 may be performed by the central processing unit 3100 and the RAM 3200.

In FIG. 10, it is illustrated that the memory system 120 may be provided as the memory system described with reference to FIG. 1. However, the memory system 120 may be replaced by the memory system 1000 described with reference to FIG. 9. In an embodiment, the computing system 3000 may be configured to include both of the memory systems 120 and 1000 described with reference to FIGS. 1 and 9.

In embodiments of the present disclosure, half memory blocks, which constitute a memory block, may be disposed on opposite sides of a read/write circuit. Thus, it may be possible to increase the degree of freedom for arranging the bit lines extending from the half memory blocks to the read/write circuit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
   a first half memory block;
   a second half memory block;
   a read/write circuit disposed between the first half memory block and the second half memory block, the read/write circuit being coupled to the first half memory block and the second half memory block through a first bit line and a second bit line, respectively; and
   a first row decoder group configured to simultaneously select the first half memory block and the second half memory block in response to a same single block selection signal.

2. The memory device of claim 1,
   wherein a portion of the first bit line extends between the first half memory block and the read/write circuit to couple the first half memory block to the read/write circuit, and wherein a portion of the second bit line extends between the second half memory block and the read/write circuit to couple the second half memory block to the read/write circuit.

3. The memory device of claim 1, wherein the first bit line extends in a direction opposite to the second bit line.

4. The memory device of claim 1, wherein the first half memory block includes a first cell string coupled to the read/write circuit through the first bit line, and the second half memory block includes a second cell string coupled to the read/write circuit through the second bit line.

5. The memory device of claim 4, wherein the first cell string is coupled to the first row decoder group through local lines of a first group, which extend toward a first side, and the second cell string is coupled to the first row decoder group through local lines of a second group, which extend toward the first side,
wherein the local lines are signal lines coupling row decoder groups to memory cell arrays.

6. The memory device of claim 5, wherein the first cell string is coupled to local lines of a third group, which extend toward a second side opposite to the first side, and the second cell string is coupled to local lines of a fourth group, which extend toward the second side.

7. The memory device of claim 6, further comprising a second row decoder group configured to simultaneously select the local lines of the third group and the local lines of the fourth group in response to the same single block selection signal, the second row decoder group being coupled to the local lines of the third group and the local lines of the fourth group.

8. The memory device of claim 6, wherein the local lines of each of the first to fourth groups include select lines divided by slits and word lines stacked under the select lines.

9. The memory device of claim 7, wherein each of the first row decoder group and the second row decoder group includes pass transistors providing operation voltages to the local lines of the first to fourth groups in response to the same single block selection signal.

10. The memory device of claim 1, wherein the first row decoder group includes a pass transistor group configured to provide operation voltages to local lines coupled to the first and second half memory blocks in response to the same single block selection signal.

11. The memory device of claim 1, wherein the read/write circuit includes:
a first page buffer group providing an operation voltage to the first bit line; and
a second page buffer group providing an operation voltage to the second bit line.

12. The memory device of claim 1, wherein the first half memory block and the second half memory block are disposed together in a plane.

13. The memory device of claim 12, wherein the read/write circuit and the first row decoder group are also disposed in the plane together with the first half memory block and the second half memory block.

14. A memory device comprising:
a first memory cell array including first half memory blocks;
a second memory cell array including second half memory blocks;
a read/write circuit disposed between the first memory cell array and the second memory cell array, the read/write circuit being coupled to the first memory cell array and the second memory cell array through bit lines of a first group and bit lines of a second group, respectively; and
a first row decoder group and a second row decoder group, each configured to simultaneously select any one of a plurality of memory block pairs in response to a same single block selection signal,
wherein each of the memory block pairs includes any one of the first half memory blocks and any one of the second half memory blocks.

15. The memory device of claim 14,
wherein a portion of the bit lines of the first group extend between the first memory cell array and the read/write circuit to couple the first memory cell array to the read/write circuit, and
wherein a portion of the bit lines of the second group extend between the second memory cell array and the read/write circuit to couple the second memory cell array to the read/write circuit.

16. The memory device of claim 14, wherein the bit lines of the first group extend in a direction opposite to the bit lines of the second group.

17. The memory device of claim 14, wherein the read/write circuit includes:
a first page buffer group providing operation voltages to the bit lines of the first group; and
a second page buffer group providing operation voltages to the bit lines of the second group.

18. The memory device of claim 14,
wherein each of the first row decoder group and the second row decoder group includes pass transistor groups for individually controlling the respective first half memory blocks, and
wherein the pass transistor groups are coupled to the respective second half memory blocks.

19. The memory device of claim 14, wherein the first memory cell array and the second memory cell array are disposed together in a same plane.

20. The memory device of claim 19, wherein the read/write circuit, the first row decoder group, and the second row decoder group are also disposed in the plane together with the first memory cell array and the second memory cell array.

* * * * *